United States Patent
Suzuki et al.

(10) Patent No.: US 7,602,241 B2
(45) Date of Patent: Oct. 13, 2009

(54) MULTIBAND DOHERTY AMPLIFIER

(75) Inventors: Yasunori Suzuki, Kanagawa (JP);
Shoichi Narahashi, Kanagawa (JP)

(73) Assignee: NTT DoCoMo, Inc., Tokyo (JP)

( * ) Notice: Subject to any disclaimer, the term of this patent is extended or adjusted under 35 U.S.C. 154(b) by 20 days.

(21) Appl. No.: 11/763,898

(22) Filed: Jun. 15, 2007

(65) Prior Publication Data

US 2008/0007331 A1    Jan. 10, 2008

(30) Foreign Application Priority Data

Jun. 23, 2006    (JP) .............................. 2006-174191

(51) Int. Cl.
*H03F 3/68* (2006.01)
(52) U.S. Cl. .................... 330/124 R; 330/295
(58) Field of Classification Search ............. 330/124 R, 330/295, 84, 126
See application file for complete search history.

(56) References Cited

U.S. PATENT DOCUMENTS

| | | | |
|---|---|---|---|
| 5,568,086 A | | 10/1996 | Schuss et al. |
| 6,396,341 B1 * | | 5/2002 | Pehlke ........................ 330/10 |
| 6,617,929 B2 * | | 9/2003 | Kim et al. .................... 330/295 |
| 7,315,207 B2 * | | 1/2008 | Shiikuma ................ 330/124 R |

FOREIGN PATENT DOCUMENTS

| | | |
|---|---|---|
| EP | 0 630 104 A2 | 12/1994 |
| JP | 3-235402 | 10/1991 |
| JP | 2004-087563 | 3/2004 |
| JP | 2006-157900 | 6/2006 |
| WO | WO 97/20385 | 6/1997 |
| WO | WO 03/061115 A1 | 7/2003 |

OTHER PUBLICATIONS

W.H. Doherty, "A New High Efficiency Power Amplifier for Modulated Waves", Proceedings of the Institute of Radio Engineers, vol. 24, No. 9, Sep. 1936, pp. 1163-1182.
Cesar Monzon, "A Small Dual-Frequency Transformer in Two Sections", IEEE Transactions on Microwave Theory and Techniques, vol. 51, No. 4, Apr. 2003, pp. 1157-1161.
Robert J. McMorrow, et al., "The Microwave Doherty Amplifier", IEEE MTT-S Digest, No. TH3E-7, Jun. 1994, pp. 1653-1656.
Frederick H. Raab, "Efficiency of Doherty RF Power-Amplifier Systems", IEEE Transactions on Broadcasting, vol. BC-33, No. 3, Sep. 1987, pp. 77-83.
Youngoo Yang, et al., "A Fully Matched N-Way Doherty Amplifier With Optimized Linearity", IEEE Transactions on Microwave Theory and Techniques, vol. 51, No. 3, Mar. 2003, pp. 986-993.

* cited by examiner

*Primary Examiner*—Henry K Choe
(74) *Attorney, Agent, or Firm*—Oblon, Spivak, McClelland, Maier & Neustadt, L.L.P.

(57) ABSTRACT

A multiband Doherty amplifier having a configuration including a divider which divides an input signal into two, a carrier amplifier which amplifies one of the divided signals, a delay element which delays the other divided signal, a peak amplifier which amplifies the output signal of the delay element, an impedance converter which is connected to an output port of the carrier amplifier and performs predetermined impedance conversion and a combiner which combines the output signals of the peak amplifier and the impedance converter, wherein the electric length of the delay element is the same as the electric length of the impedance converter and the impedance converter has N (N≧2) cascade-connected impedance conversion transmission lines and performs substantially the same impedance conversion at each of the N frequencies.

2 Claims, 8 Drawing Sheets

MULTIBAND DOHERTY AMPLIFIER

TECHNICAL FIELD

The present invention relates to a high efficiency power amplifier for a transmitter, and more particularly, to a Doherty amplifier.

BACKGROUND ART

A Doherty amplifier configuration is known as a configuration to achieve high efficiency of a power amplifier, in which two amplification circuits of different operation classes are arranged in parallel (e.g., see Non-Patent literature 1). FIG. 10 shows a basic configuration of a conventional Doherty amplifier.

As shown in FIG. 10, a conventional Doherty amplifier 100 is constructed of a divider 101 which divides an input signal into two, a carrier amplifier 102 to which one of the divided signals from the divider 101 is inputted, a ¼-wave transmission line 104 to which the other divided signal is inputted, a peak amplifier 105 to which the output signal of the ¼-wave transmission line 104 is inputted, a ¼-wave transmission line 103 to which the output signal of the carrier amplifier 102 is inputted and a combiner 106 which combines the output signal of the ¼-wave transmission line 103 and the output signal of the peak amplifier 105.

For example, the carrier amplifier 102 operates class-AB or class-B biasing and the peak amplifier 105 operates class-C biasing. Furthermore, the peak amplifier 105 is set so as to operate only when the carrier amplifier 102 operates around the saturation output power. When the input signal current is sufficiently small, the Doherty amplifier 100 is operative to amplify the input signal using only the carrier amplifier 102. On the other hand, when the input signal current is at such a high level that the carrier amplifier 102 operates around saturation output power, the Doherty amplifier 100 operates to combine the output signals of the carrier amplifier 102 and that of the peak amplifier 105 by the combiner 106.

Because the peak amplifier 105 does not operate when the input signal current is small, the Doherty amplifier 100 thereby can reduce power consumption. Moreover, when the input signal current is larger than a predetermined current where the peak amplifier 105 just operates, the carrier amplifier 102 and the peak amplifier 105 operate simultaneously. The efficiency of the Doherty amplifier 100 is higher than that of the conventional amplifier which corresponds to the carrier amplifier 102. Therefore, the Doherty amplifier 100 can achieve highly efficient amplification as a whole.

The Doherty amplifier 100 has the ¼-wave transmission line 103 on the output side of the carrier amplifier 102. With this function of the ¼-wave transmission line 103, a load impedance at the output port of the carrier amplifier 102 changes depending on ON/OFF of the peak amplifier 105. This further improves the efficiency of the Doherty amplifier 100. Hereinafter, this reason will be explained in brief.

First, for simplicity of explanation, suppose that the ¼-wave transmission line 103 of the Doherty amplifier 100 is a lossless, distributed constant transmission line. Generally, the following relationship holds in a lossless transmission line.

$$\begin{bmatrix} V_L \\ I_L \end{bmatrix} = \begin{bmatrix} \cos\beta L & j \cdot R_0 \sin\beta L \\ (j/R_0)\sin\beta L & \cos\beta L \end{bmatrix} \begin{bmatrix} V_0 \\ I_0 \end{bmatrix} \quad (1)$$

$V_0$ and $I_0$ denote a voltage value and a current value at an input port of the lossless transmission line, respectively. Furthermore, $V_L$ and $I_L$ denote a voltage value and a current value at an output port of the lossless transmission line, respectively. $\beta$ and L denote a frequency-dependent phase constant and a transmission line length, respectively. j and $R_0$ denote an imaginary number unit and a characteristic impedance of the lossless transmission line, respectively.

In the case of the ¼-wave transmission line 103, since $\beta L = \pi/2$ is satisfied, the following relationship holds in the ¼-wave transmission line 103.

$$\begin{bmatrix} V_L \\ I_L \end{bmatrix} = \begin{bmatrix} 0 & j \cdot R_0 \\ j/R_0 & 0 \end{bmatrix} \begin{bmatrix} V_0 \\ I_0 \end{bmatrix} \quad (2)$$

When an impedance seen looking into the output side of the Doherty amplifier 100 from the joint between the output port of the ¼-wave transmission line 103 and the peak amplifier 105 is $R_0/2$, the ¼-wave transmission line 103 is set so that the characteristic impedance becomes $R_0$.

When the input signal current of the Doherty amplifier 100 is smaller than the predetermined current and the peak amplifier 105 is OFF, an output impedance of the peak amplifier 105 ideally becomes infinite. In this case, the load impedance $V_L/I_L$ at the output port of the ¼-wave transmission line 103 becomes $R_0/2$. Therefore, from Equation (2), $$R_0/2 = V_L/I_L = \{j \cdot R_0 \cdot I_0\}/\{(j \cdot V_0)/R_0\} = R_0^2 \cdot (I_0/V_0) \quad (3)$$

holds. Equation (3) can be modified as:

$$V_0/I_0 = 2R_0 \quad (4)$$

This indicates that a load impedance at the input port of the ¼-wave transmission line 103, that is, that at the output port of the carrier amplifier 102 becomes $2R_0$.

On the other hand, when the input signal current is larger than the predetermined current and the peak amplifier 105 is ON, the carrier amplifier 102 and the peak amplifier 105 operate in parallel and the output signals of both amplifiers are combined. In this case, the load impedance $V_L/I_L$ at the output port of the ¼-wave transmission line 103 becomes $R_0$, while the load impedance at the output port of the peak amplifier 105 also becomes $R_0$. Therefore, from Equation (2), $$R_0 = V_L/I_L = \{j \cdot R_0 \cdot I_0\}/\{(j \cdot V_0)/R_0\} = R_0^2 \cdot (I_0/V_0) \quad (5)$$

holds. Equation (5) can be modified as:

$$V_0/I_0 = R_0 \quad (6)$$

This indicates that the load impedance at the input port of the ¼-wave transmission line 103, that is, that at the output port of the carrier amplifier 102 becomes $R_0$.

When the peak amplifier 105 is OFF, the load impedance at the output port of the carrier amplifier 102 becomes $2R_0$ and when the peak amplifier 105 is ON, that at the output port of the carrier amplifier 102 becomes $R_0$.

The carrier amplifier 102 is designed to offer smaller saturation output power and higher efficiency, when the load impedance at the output port of the carrier amplifier 102 becomes $2R_0$. As a result, when the input signal current is smaller than the predetermined current and the peak amplifier 105 is OFF, the Doherty amplifier can offer high efficiency amplification.

On the other hand, the carrier amplifier 102 and the peak amplifier 105 are designed such that when their load impedances at their output ports are $R_0$, the Doherty amplifier 100 is designed to maximize the saturation output power. As a result, the Doherty amplifier 100 when the peak amplifier 105 is ON can offer larger saturation output power and more linear amplification than that when the peak amplifier 105 is OFF. Here, while the carrier amplifier 102 operates a saturation output power, the amount of current inputted to the peak amplifier 105 can be reduced accordingly; therefore, it is possible to further prevent the peak amplifier 105 from being saturated.

Non-Patent literature 1: W. H. Doherty, "A new high efficiency power amplifier for modulated waves", Proc. IRE, Vol. 24, No. 9, pp. 1163-1182, September 1936.

In this way, the features of the conventional Doherty amplifier 100 are an ON/OFF operation of the peak amplifier 105 and a high efficiency amplification operation using an impedance conversion circuit by means of the ¼-wave transmission line 103. Here, as shown in Equation (1), the relationship between the impedance $V_0/I_0$ at the input port of the ¼-wave transmission line 103 and the impedance $V_L/I_L$ at its output port depends on the frequency of the transmission signal (because the phase constant β depends on the frequency). In the conventional Doherty amplifier 100, the ¼-wave transmission line 103 is designed to perform a desired impedance conversion at one frequency (for example, the center frequency of the frequency band in which a signal should be amplified). Therefore, the ¼-wave transmission line 103 does not perform the desired impedance conversion at other frequency bands. In this case, the combination of the output of the carrier amplifier 102 and the output of the peak amplifier 105 is no longer optimal and the operation of the Doherty amplifier 100 becomes incomplete.

FIG. 11 shows the input impedance expressed by amplitude (Mag) and phase (Phase) on the carrier amplifier 102 side (Port1) of the ¼-wave transmission line 103 which is designed to perform a desired impedance conversion at design frequency 2 GHz. As shown in FIG. 11, the input impedance of the ¼-wave transmission line 103 designed in this way becomes design value 100 Ohm at design frequency 2 GHz, but it does not become 100 Ohm at other frequencies.

In this way, in the conventional Doherty amplifier 100, the frequency band in which the Doherty amplifier 100 operates is determined according to the design frequency of the ¼-wave transmission line 103. Therefore, the conventional Doherty amplifier 100 is unable to operate with sufficient gain and efficiency in a frequency band at a center frequency other than the design frequency (except the case where βL in Equation (1) is an even multiple of π/2).

SUMMARY OF THE INVENTION

The present invention has been implemented in view of the above described aspects and it is an object of the present invention to provide a multiband Doherty amplifier capable of obtaining sufficient operation performance for a plurality of frequency bands.

The multiband Doherty amplifier according to the present invention includes a divider which divides an input signal into two, a carrier amplifier which is connected to one output port of the divider and amplifies one of the divided signals, a delay element which is connected to the other output port of the divider and delays the other divided signal, a peak amplifier which is connected to an output port of the delay element and amplifies the output signal, an impedance converter which is connected to an output port of the carrier amplifier and performs an impedance conversion and a combiner which is connected to an output port of the peak amplifier and an output port of the impedance converter and combines those output signals, wherein an electric length of the delay element is equal to an electric length of the impedance converter, the impedance converter has a cascade connection of N (N≧2) impedance conversion transmission lines so as to perform equal impedance conversions on the N frequencies.

The "electric length of the delay element is equal to that of the impedance converter" implicates not only a case where the electric length of the delay element is completely equal to that of the impedance converter but also a case where these are approximate to each other to an extent that desired performance as the multiband Doherty amplifier is obtained. Furthermore, "perform the same impedance conversion for N frequencies" implicates not only a case where the same impedance conversion is performed for the N frequencies but also a case where substantially the same impedance conversion is performed for N frequencies to an extent that desired performance as the multiband Doherty amplifier is obtained. Furthermore, that the impedance converter "performs the same impedance conversion for N frequencies" means that the relationship that when the impedance at one port of the impedance converter is Z1, the impedance at the other port of the impedance converter is Z2 holds for each of the N frequencies. These also apply to detailed explanations of embodiments and claims of the patent.

Here, such an impedance converter sets the load impedance at the output port of the carrier amplifier to an identical value for the N (N≧2) frequencies. In this way, it is possible to cause the carrier amplifier to operate optimally for the N frequencies and consequently realize a Doherty amplifier capable of performing operation with sufficient gain and efficiency for a plurality of frequency bands. Furthermore, connecting the delay element having the same electric length as that of the impedance converter in parallel to the impedance converter allows delays of signals by the impedance converter to be corrected.

Furthermore, according to the present invention, the delay element may be a delay transmission line having a configuration different from that of the impedance converter. The delay element (delay line) at the input port of the peak amplifier only needs to make the delay time via the delay element and the peak amplifier equal to the delay time via the carrier amplifier and the impedance converter. Therefore, the delay element does not need to use the same configuration as that of the above described impedance converter and a design can be made in various components.

Furthermore, the combiner of the present invention preferably has a configuration with N impedance conversion transmission lines cascade-connected to a joint between the output port of the peak amplifier and the output port of the impedance converter. The configuration with N cascade-connected impedance conversion transmission lines performs identical impedance conversions for N frequencies.

Using such a combiner allows the load impedance at the joint to be set to an equal value with respect to the above described N frequencies. This allows the carrier amplifier to be operated more optimally for the N frequencies and can consequently realize a Doherty amplifier capable of sufficient gain and efficiency operation for a plurality of frequency bands.

Furthermore, the combiner configuration with the N cascade-connected impedance conversion transmission line can be matched the output impedance from the joint and the load impedance from the joint with respect to N frequencies, when the peak amplifier is ON.

This leads that it is important for the multiband Doherty amplifier to improve in the efficiency when the peak amplifier is ON.

DETAILED DESCRIPTION OF THE INVENTION

Hereinafter, embodiments of the present invention will be explained with reference to the attached drawings.

[Configuration]

Figure 1:
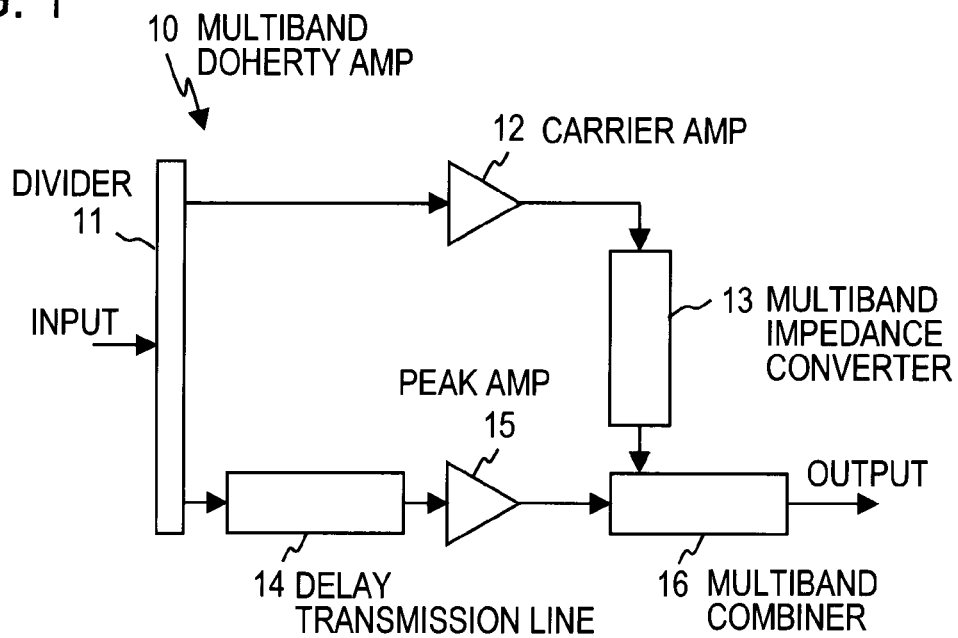
FIG. 1 is a block diagram illustrating the configuration of a multiband Doherty amplifier according to the present invention.

FIG. 1 is a block diagram illustrating the configuration of a multiband Doherty amplifier 10 according to the present invention.

The embodiment of the multiband Doherty amplifier 10 illustrated in FIG. 1 has a divider 11 which divides an input signal into two, a carrier amplifier 12 which is connected to one output port of the divider 11 and amplifies one of the divided signals from the divider 11, a delay transmission line 14 which is connected as a delay element to the other output port of the divider 11 and causes the other divided signal to delay, a peak amplifier 15 which is connected to an output port of the delay transmission line 14 and amplifies the output signal, a multiband impedance converter 13 which is connected to an output port of the carrier amplifier 12 and performs an impedance conversion and a multiband combiner 16 which is connected to an output port of the peak amplifier 15 and an output port of multiband impedance converter 13 and combines the output signal of the peak amplifier 15 and the output signal of the multiband impedance converter 13.

<Divider 11>

The divider 11 can be configured by, for example, a Wilkinson power divider which allows power to be evenly divided in each of N (N≧2) frequency bands, or a directional coupler or the like. More specifically, when the center frequency ratio at each of the frequency bands is 2 or less, the divider 11 can be configured by, for example, a branch type directional coupler, coupling type directional coupler or a Wilkinson power divider with optimized design or the like. Furthermore, when the center frequency ratio at each of the frequency bands is 2 or larger, the divider 11 can be configured by a multi-section coupling type directional coupler or a multi-section Wilkinson power divider or the like. When the amplification characteristic of the multiband Doherty amplifier 10 is taken into consideration, the divider 11 preferably has the configuration that divides power as evenly as possible. However, even if the divider 11 does not divide power evenly, it is possible to correct the divided power errors of the divider 11 by adjusting the gain of the carrier amplifier 12 or the peak amplifier 15. In this case, the degree of freedom of the design of the divider 11 is increased, which can facilitate the embodiment of the divider 11.

<Multiband Impedance Converter 13>

Figure 2A:
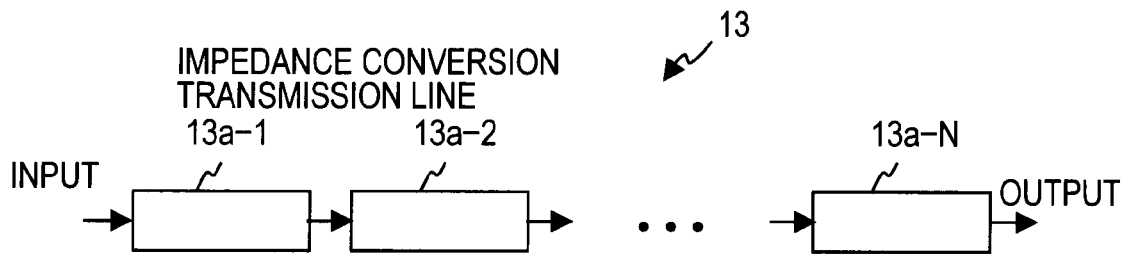
FIG. 2A is a conceptual diagram illustrating the configuration of a multiband impedance converter provided for the multiband Doherty amplifier shown in FIG. 1.

FIG. 2A is a conceptual diagram illustrating the configuration of the multiband impedance converter 13 provided for the multiband Doherty amplifier 10 shown in FIG. 1.

As shown in FIG. 2A, the multiband impedance converter 13 has a configuration with N (N≧2) cascade-connected impedance conversion transmission lines 13a-1 to 13a-N. This multiband impedance converter 13 performs the same impedance conversion at N frequencies. The significance of "the same impedance conversion" is as described previously.

The configuration of such a multiband impedance converter 13 is disclosed, for example, in the following reference document 1.

Reference document 1: Cesar Monzon, "A small dual-frequency transformer in two section", IEEE Transactions on Microwave Theory and Techniques, Vol. 51, No. 4, pp. 1157-1161, April 2003

Figure 2B:
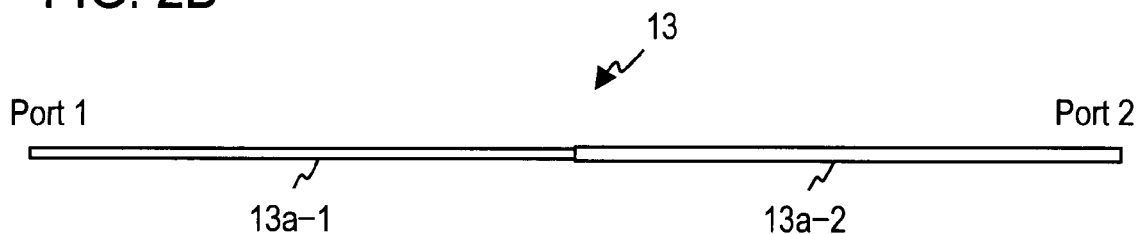
FIG. 2B shows a configuration example of the multiband impedance converter in a case where N=2.

FIG. 2B shows a configuration example of the multiband impedance converter 13 in a case where N=2.

The multiband impedance converter 13 illustrated in FIG. 2B has a configuration with two impedance conversion transmission lines 13a-1, 13a-2 of different line widths cascade-connected from the Port1 side. The multiband impedance converter 13 illustrated here is a microstrip line formed on a dielectric substrate whose dielectric constant is 2.2. In the case of this example, the impedance conversion transmission line 13a-1 is a transmission line having a characteristic impedance of 79 Ohm, the impedance conversion transmission line 13a-2 is a transmission line having a characteristic impedance of 63.6 Ohm and the length of each impedance conversion transmission lines 13a-1, 13a-2 in the longitudinal direction is 50 mm. The multiband impedance converter 13 configured in this way performs the same impedance conversions at two frequencies 1 GHz and 2 GHz. That is, the relationship between 100 Ohm of the port 1 impedance and 50 Ohm of the port 2 impedance satisfies the signal frequencies at 1 GHz and 2 GHz.

The multiband impedance converter 13 in the example of FIG. 2B is a microstrip line formed on a dielectric substrate, but the configuration of the multiband impedance converter 13 is not limited to this. That is, the multiband impedance converter 13 may also be configured by a strip line, coplanar waveguide or the like or a configuration with the multiband impedance converter 13 incorporated in the divider 11 may also be adopted.

Figure 4:
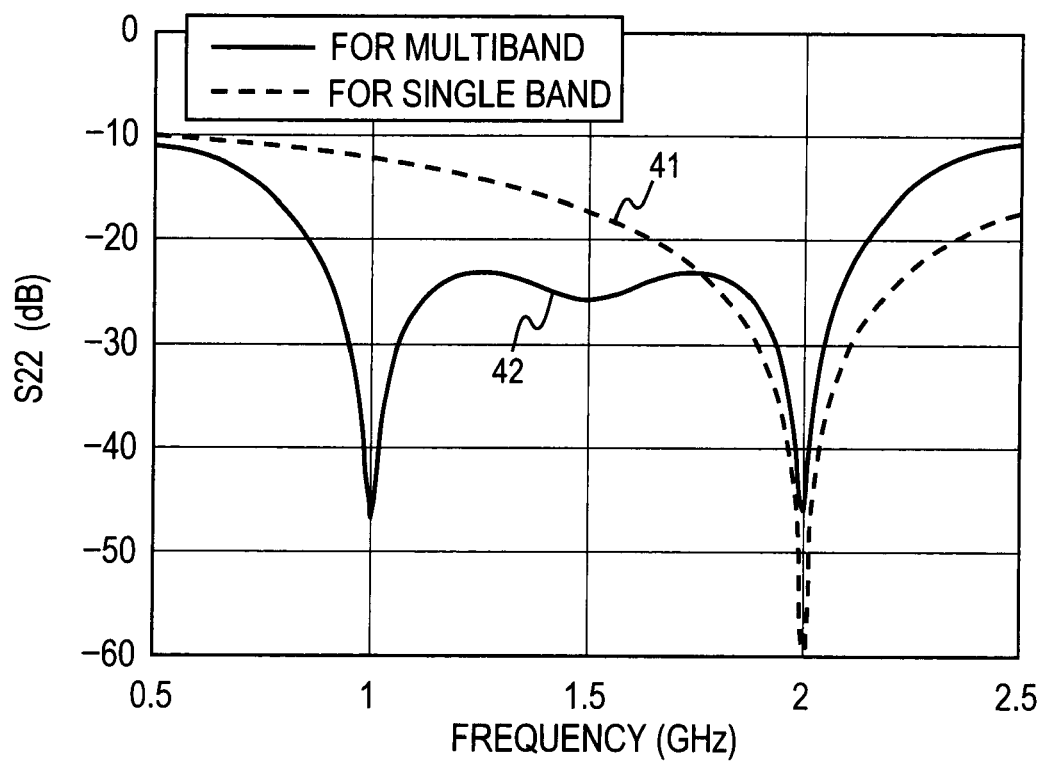
FIG. 4 shows a computer simulation result of a S22 characteristic (reflection characteristic) of a single-band impedance converter and the multiband impedance converter in FIG. 2B.

FIG. 4 shows the computer simulation results of S22 characteristics (reflection characteristics) of a non-multiband impedance converter (hereinafter referred to as a "single-band impedance converter") used for a conventional Doherty amplifier and the multiband impedance converter 13 in the example of FIG. 2B. Curve 41 and 42 show the characteristics of the single-band impedance converter and the multiband impedance converter, respectively. The single-band impedance converter in this example is a ¼-wave transmission line in which the impedance on the Port2 side becomes 50 Ohm when the impedance on the Port1 side is 100 Ohm at frequency 2 GHz.

As illustrated in FIG. 4, when the signal frequency is 2 GHz, the S22 characteristic is equal to or less than −40 dB for both the single-band impedance converter and the multiband impedance converter 13 in the example of FIG. 2B. This indicates that impedance matching is well established in both impedance converters when the frequency of the signal is 2 GHz.

On the other hand, when the frequency of the signal is 1 GHz, the S22 characteristic 41 in the single-band impedance converter is approximately −13 dB and the S22 characteristic 42 in the multiband impedance converter 13 in the example of FIG. 2B is approximately −45 dB. This indicates that when the frequency of the signal is 1 GHz, impedance matching of the multiband impedance converter 13 in the example of FIG. 2B is well established, whereas impedance matching of the conventional impedance converter is not well established.

Figure 5:
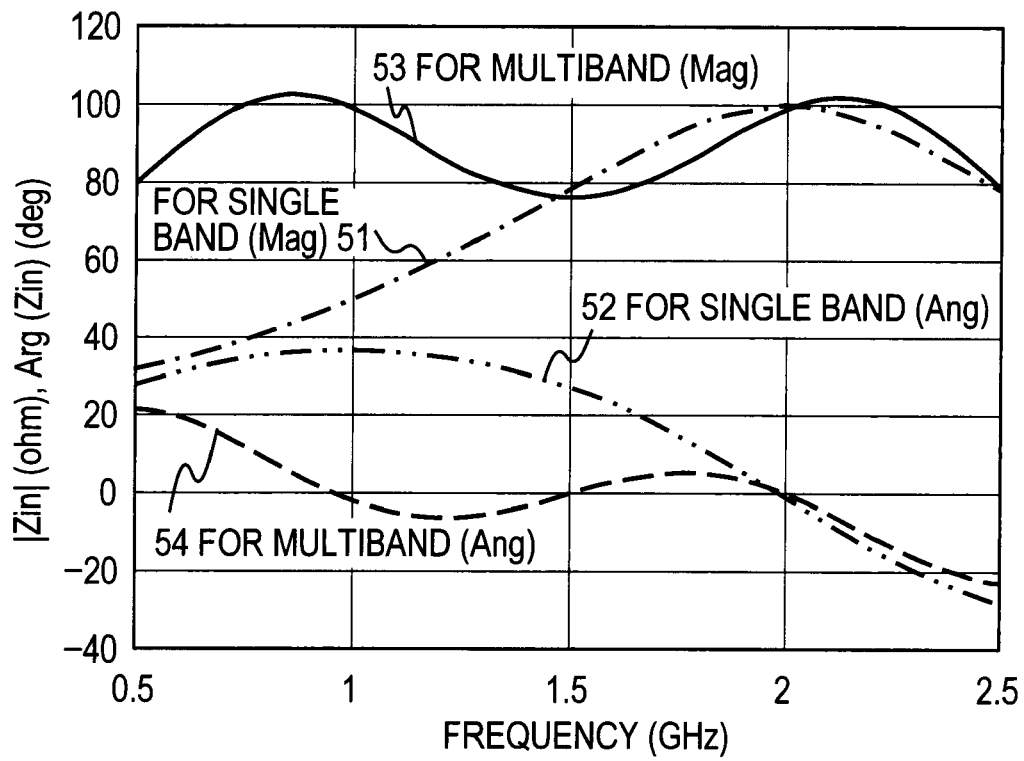
FIG. 5 shows frequency characteristics of the impedance on the Port1 side of the single-band impedance converter and the multiband impedance converter in FIG. 2B.

FIG. 5 shows the frequency characteristics of the impedance (amplitude and phase) on the Port1 side of the single-band impedance converter and the multiband impedance converter 13 in the example of FIG. 2B. Curves 51 and 52 show absolute value characteristics of the impedance and phase characteristics of the single-band impedance converter, respectively, while curves 53 and 54 show absolute value characteristics of the impedance and phase characteristics of the multiband impedance converter, respectively.

FIG. 5 shows the data when the impedance on the Port2 side of each impedance converter is 50 Ohm.

As shown in FIG. 5, when the frequency of the signal is 2 GHz, both the single-band impedance converter and multiband impedance converter 13 in the example of FIG. 2B have the impedance on the Port1 side is of magnitude 100 Ohm and argument 0 deg.

On the other hand, when the frequency of the signal is 1 GHz, the impedance on the Port1 side of the single-band impedance converter is of magnitude 50 Ohm, argument 35 deg. In this way, in the single-band impedance converter, the impedance on the Port1 side has the frequency dependence. This indicates that the impedance converter using the conventional ¼-wave transmission line cannot establish impedance matching at a plurality of frequencies (1 GHz and 2 GHz in this example).

On the other hand, as for the multiband impedance converter 13 in the example of FIG. 2B, even when the frequency of the signal is 1 GHz, the impedance on the Port1 side is of magnitude 100 Ohm, argument 0 deg. This indicates that the multiband impedance converter 13 in the example of FIG. 2B can establish impedance matching at a plurality of frequencies (1 GHz and 2 GHz in this example).

Furthermore, when such a multiband impedance converter 13 is used, the load impedance at the output side of the carrier amplifier 12 assumes a substantially the same as that at a plurality of frequencies (1 GHz and 2 GHz in this example). Therefore, if the carrier amplifier 12 is set so that the carrier amplifier 12 performs a high efficiency operation with respect to the load impedance, it is possible to realize a high efficiency amplification operation at the plurality of frequencies.

<Delay Transmission Line 14>

The delay transmission line 14 is configured to have an electric length which is equal to that of the multiband impedance converter 13. This causes the phase of the signal on the peak amplifier 15 side to be delayed by the electric length of the multiband impedance converter 13 and allows the phase of the signal on the carrier amplifier 12 side to match the phase of the signal on the peak amplifier 15 side. The significance of "equal" here is as described previously. Furthermore, a transmission line having the same configuration as that of the multiband impedance converter 13 may be used for the delay transmission line 14, but this is not always necessary and any type of transmission line such as a transmission line having a characteristic impedance 50 Ohm can be used if it has at least substantially the same electric length as that of the multiband impedance converter 13. This is because impedance mismatching on the input side of the peak amplifier 15 does not have a large effect on the operation of the multiband Doherty amplifier 10 because of an inner matching circuit of the peak amplifier 15 (data indicating this will be described later).

<Carrier Amplifier 12>

The carrier amplifier 12 is an amplifier that can obtain a gain in N frequency bands having the above described N frequencies as their respective center frequencies. A bias voltage of the carrier amplifier 12 is generally set to class AB or class B. For a microwave semiconductor used for the carrier amplifier 12, a device which has a small signal gain sufficient at least in the above described N frequency bands is used. For example, when amplified in two frequency bands whose center frequencies are 1 GHz and 2 GHz respectively (N=2), it is possible to use GaAs MESFET or the like which can amplify up to the C band.

Furthermore, the configurations of the input matching circuit and the output matching circuit are determined for the carrier amplifier 12 so that the required gain can be obtained in the above described N frequency bands. This allows the carrier amplifier 12 to attain the required gain in the above described N frequency bands. Even if there are gain differences among the frequency bands, there will be no particular problem if the gain differences fall within a predetermined range in which the multiband Doherty amplifier 10 can obtain the required characteristic.

<Peak Amplifier 15>

The peak amplifier 15 is an amplifier that can attain the required gain in the above described N frequency bands. A bias voltage of the peak amplifier 15 is generally set deeper than the bias voltage of the carrier amplifier 12 (e.g., biased to class C). A microwave semiconductor used for the peak amplifier 15 is selected according to the same operational bandwidth as that of the carrier amplifier 12.

Furthermore, as for the peak amplifier 15, the configurations of the input matching circuit and the output matching circuit thereof are determined so that the required gain can be attained in the above described N frequency bands. This allows the peak amplifier 15 to attain the required gain at the above described N frequency bands. Even if there is a gain difference among the frequency bands, there will be no particular problem if each gain difference falls within the range in which the multiband Doherty amplifier 10 can obtain the required characteristic.

<Multiband Combiner 16>

The multiband combiner 16 has a configuration in which the output port of the multiband impedance converter 13 is joined to the output port of the peak amplifier 15 and N impedance conversion transmission lines are cascade-connected to the joint thereof. The configuration with the N cascade-connected impedance conversion transmission lines performs identical impedance conversions for the above described N frequencies. Details of such a configuration are disclosed, for example, in above described Reference Document 1.

With this multiband combiner 16, it is possible to cause the output impedances seen looking into the carrier amplifier 12 and the peak amplifier 15 from the above described joint to match the load impedance seen looking to the output of the multiband Doherty amplifier 100 from the joint for the above described N frequencies. The output impedances seen looking into the carrier amplifier 12 and the peak amplifier 15 from the above described joint vary when the peak amplifier 15 is OFF (ideally the output impedance of the peak amplifier 15 is infinite) and when the peak amplifier 15 is ON. Therefore, the configuration with the N cascade-connected impedance conversion transmission lines cannot establish complete impedance matching for both cases where the peak amplifier 15 is OFF and ON. When the peak amplifier 15 is ON, the multiband combiner 16 of the present invention causes the load impedance seen from the above described joint to match both the output impedances seen looking into the carrier amplifier 12 and the peak amplifier 15 from the above described joint for the above described N frequencies. This is because the efficiency when the peak amplifier is ON is more important to the multiband Doherty amplifier 10 than the efficiency when the peak amplifier is OFF.

Figure 3A:
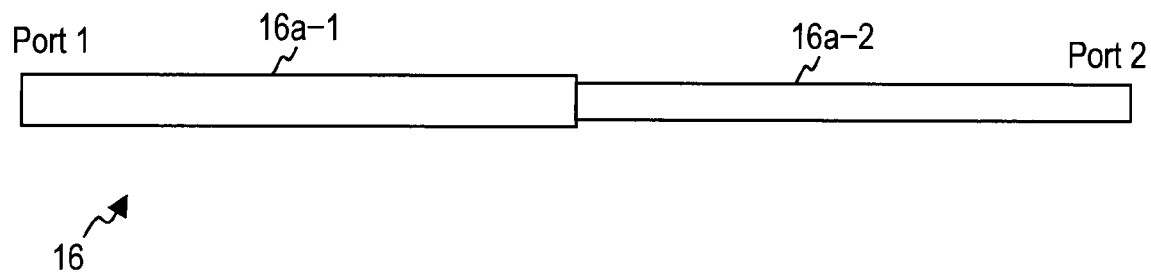
FIG. 3A shows a configuration example of the multiband combiner in a case where N=2.

FIG. 3A shows a configuration example of the multiband combiner 16 in a case where N=2.

The multiband combiner 16 illustrated in FIG. 3A has a configuration with two impedance conversion transmission lines 16a-1, 16a-2 of different line widths cascade-connected from the Port1 side. The multiband combiner 16 illustrated here is a microstrip line formed on a dielectric substrate whose dielectric constant is 2.2. In the case of this example, the impedance conversion transmission line 16a-1 is a transmission line having a characteristic impedance of 31.46 Ohm, the impedance conversion transmission line 16a-2 is a transmission line having a characteristic impedance of 39.78 Ohm and the length of each of the impedance conversion transmission lines 16a-1 and 16a-2 in the longitudinal direction is 50 mm. The multiband combiner 16 configured in this way performs the same impedance conversion at two frequencies 1 GHz and 2 GHz. That is, the relationship between 50 Ohm of the impedance at the Port 2 and 25 Ohm of the impedance at the Port 1 satisfies the signal frequencies at 1 GHz and 2 GHz.

The multiband combiner 16 in the example of FIG. 3A is a microstrip line formed on a dielectric substrate, but the configuration of the multiband combiner 16 is not limited to this. That is, the multiband combiner 16 may also be configured by a strip line, coplanar waveguide or the like.

Figure 3B:
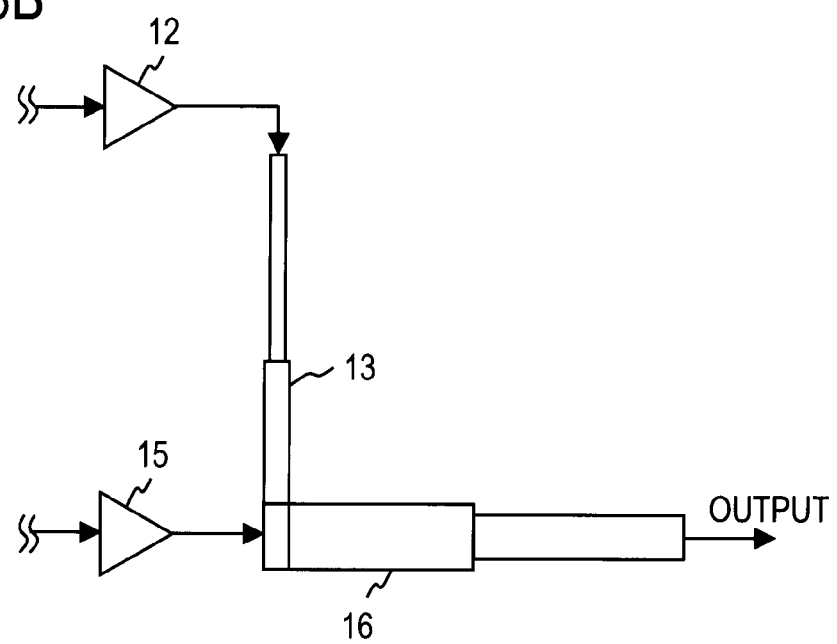
FIG. 3B shows the connection configuration of the multiband combiner in FIG. 3A.

FIG. 3B shows the connection configuration of the multiband combiner 16 in the example of FIG. 3A.

As shown in FIG. 3B, one end on the Port1 side of the multiband combiner 16 in the example of FIG. 3A is connected to a joint between the output port of the multiband impedance converter 13 and the output port of the peak amplifier 15 and the other port is connected to an outside load (50 Ohm, not shown) of the multiband Doherty amplifier 10. In this way, the multiband combiner 16 in the example of FIG. 3A converts the load impedance at the above described joint to 25 Ohm at two frequencies of 1 GHz and 2 GHz and allows matching with the input impedance at the above described joint when the peak amplifier 15 is ON.

[Simulation Result 1]

Computer simulation results of the multiband Doherty amplifier 10 of the present invention and the conventional Doherty amplifier will be shown below. The following simulation results are ones in a case where N=2, using the multiband impedance converter 13 illustrated in FIG. 2B and the multiband combiner 16 illustrated in FIG. 3A. Here, also suppose that both the multiband Doherty amplifier 10 of the present invention and the conventional Doherty amplifier use C-band GaAs MESFET for the carrier amplifier and the peak amplifier. Furthermore, the input signal is also assumed to be a CW1 wave (carrier).

Figure 6A:
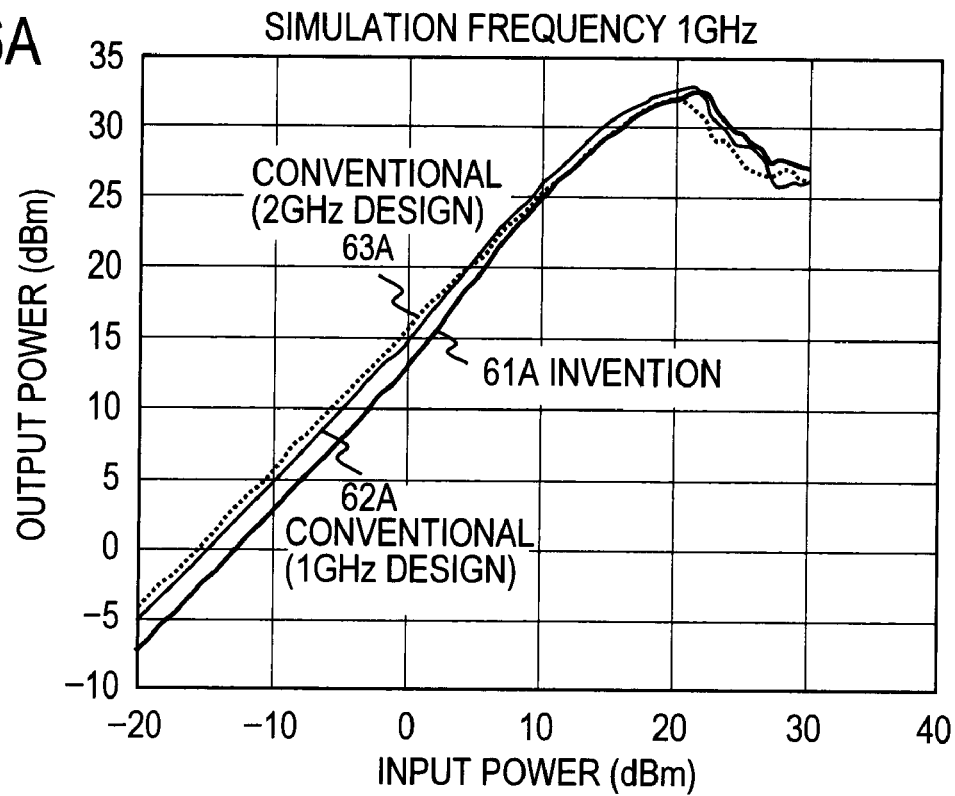
FIG. 6A shows input/output characteristics of the multiband Doherty amplifier of the present invention, a conventional Doherty amplifier whose design frequency is 1 GHz and a conventional Doherty amplifier whose design frequency is 2 GHz when the simulation frequency of the input signal is 1 GHz.

FIG. 6A shows the input/output characteristics 61A of the multiband Doherty amplifier 10 of the present invention, the input/output characteristics 62A of the conventional Doherty amplifier whose design frequency is 1 GHz and the input/output characteristics 63A of the conventional Doherty amplifier whose design frequency is 2 GHz when the simulation frequency of the input signal is 1 GHz. The horizontal and vertical axes show the input power and the output power, respectively.

As shown in FIG. 6A, the input and output characteristics 61A of the multiband Doherty amplifier of the present invention are the same as that 62A, 63A of conventional Doherty amplifier at the simulation frequency 1 GHz. The saturation output power is 32 dBm, while the gain is approximately 10 dB.

Figure 6B:
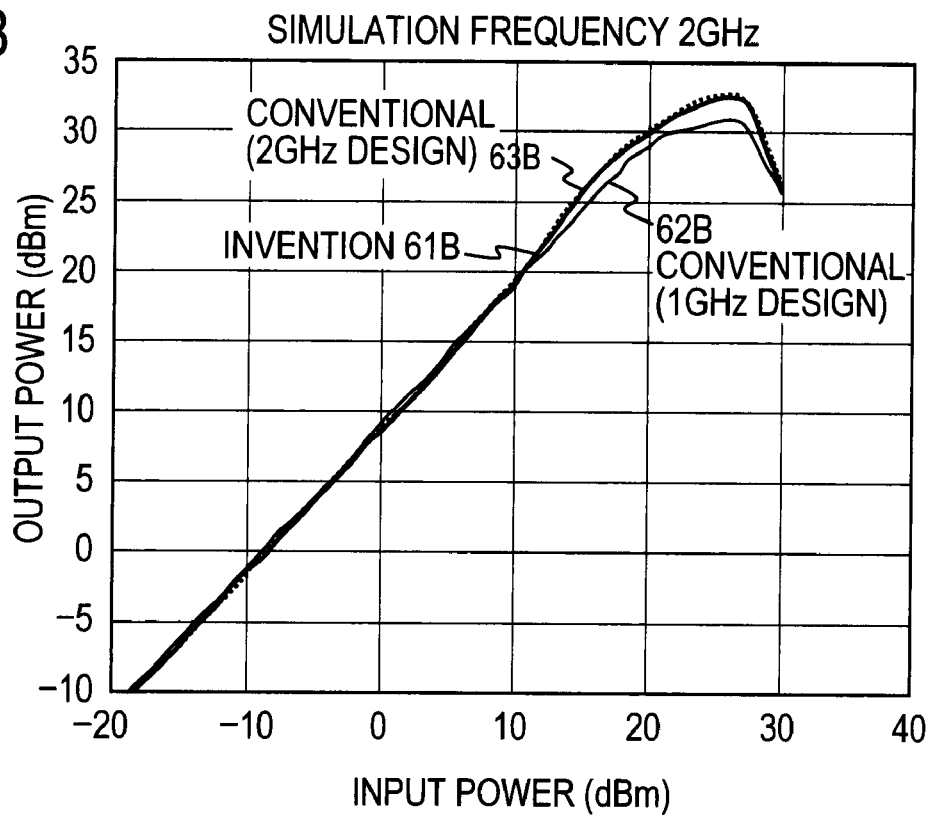
FIG. 6B shows input/output characteristics of the multiband Doherty amplifier of the present invention, a conventional Doherty amplifier whose design frequency is 1 GHz and a conventional Doherty amplifier whose design frequency is 2 GHz when the simulation frequency of the input signal is 2 GHz.

Furthermore, FIG. 6B shows the input/output characteristics 61B of the multiband Doherty amplifier 10 of the present invention, the input/output characteristics 62B of the conventional Doherty amplifier whose design frequency is 1 GHz and the input/output characteristics 63B of the conventional Doherty amplifier whose design frequency is 2 GHz when the simulation frequency of the input signal is 2 GHz. The horizontal and vertical axes show the input power and the output power, respectively.

As shown in FIG. 6B, the input/output characteristics 61B of the multiband Doherty amplifier of the present invention are almost the same as that 62B, 63B of conventional Doherty amplifier at the simulation frequency 2 GHz.

Figure 7A:
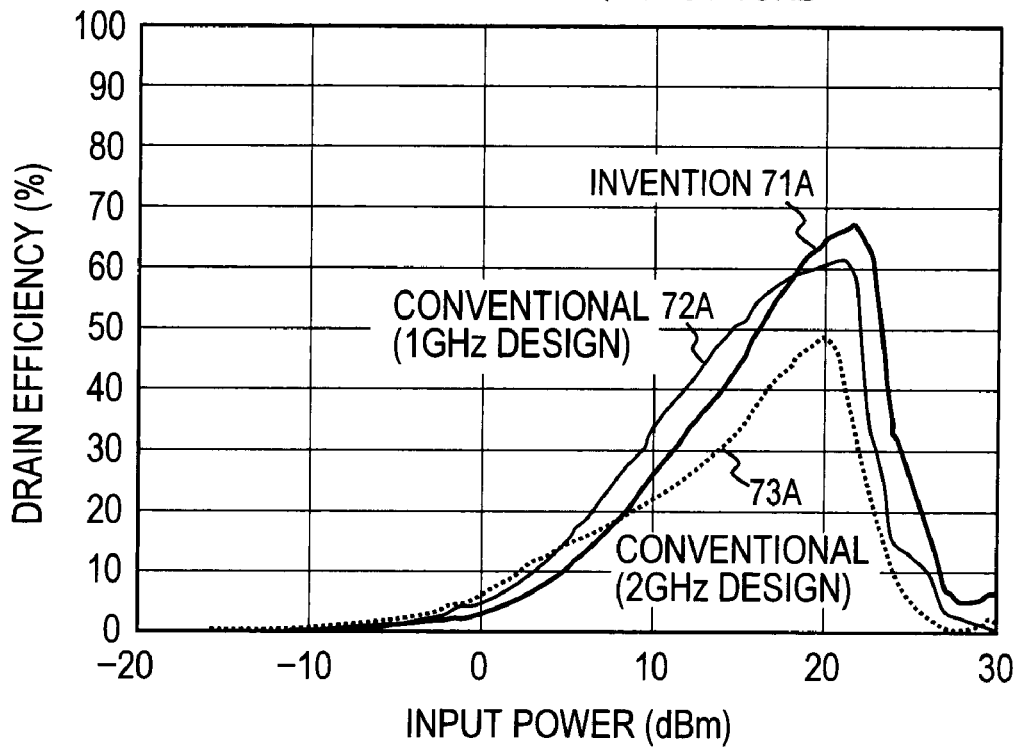
FIG. 7A shows drain efficiency characteristics of the multiband Doherty amplifier 10 of the present invention, a conventional Doherty amplifier whose design frequency is 1 GHz and a conventional Doherty amplifier whose design frequency is 2 GHz when the simulation frequency of the input signal is 1 GHz.

FIG. 7A shows the drain efficiency characteristic 71A of the multiband Doherty amplifier 10 of the present invention, the drain efficiency characteristic 72A of the conventional Doherty amplifier whose design frequency is 1 GHz and the drain efficiency characteristic 73A of the conventional Doherty amplifier whose design frequency is 2 GHz when the simulation frequency of the input signal is 1 GHz. The horizontal and vertical axes show the input power and the drain efficiency.

As shown in FIG. 7A, when the simulation frequency of the input signal is 1 GHz, the maximum drain efficiency of the conventional Doherty amplifier whose design frequency is 1 GHz is approximately 60% and the maximum drain efficiency of the conventional Doherty amplifier whose design frequency is 2 GHz is approximately 50%. In contrast, the maximum drain efficiency of the multiband Doherty amplifier 10 of the present invention is as high as 67.1%.

Figure 7B:
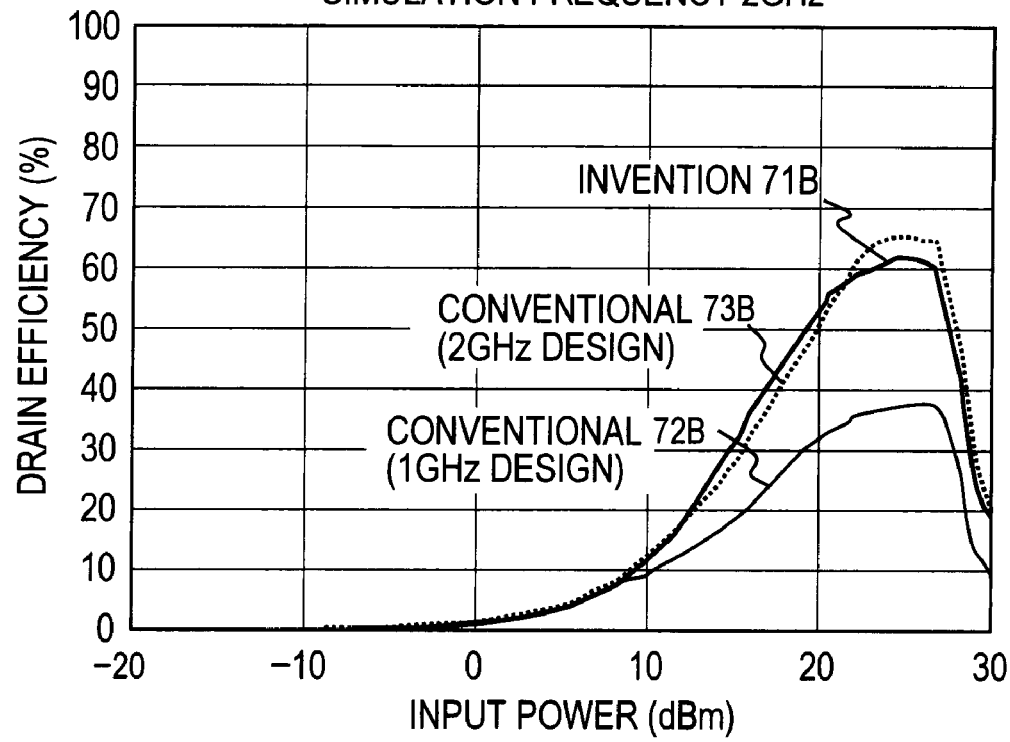
FIG. 7B shows drain efficiency characteristics of the multiband Doherty amplifier 10 of the present invention, a conventional Doherty amplifier whose design frequency is 1 GHz and a conventional Doherty amplifier whose design frequency is 2 GHz when the simulation frequency of the input signal is 2 GHz.

FIG. 7B shows the drain efficiency characteristic 71B of the multiband Doherty amplifier 10 of the present invention, the drain efficiency characteristic 72B of the conventional Doherty amplifier whose design frequency is 1 GHz and the drain efficiency characteristic 73B of the conventional Doherty amplifier whose design frequency is 2 GHz when the simulation frequency of the input signal is 2 GHz. The horizontal and vertical axes show the input power and the drain efficiency.

As shown in FIG. 7B, when the simulation frequency of the input signal is 2 GHz, the maximum drain efficiency of the conventional Doherty amplifier whose design frequency is 1 GHz is approximately 40% and the maximum drain efficiency of the conventional Doherty amplifier whose design frequency is 2 GHz is approximately 66%. In contrast, the maximum drain efficiency of the multiband Doherty amplifier 10 of the present invention is 62.4%.

It is appreciated from FIGS. 7A and 7B that the conventional Doherty amplifier shows a maximum drain efficiency as high as 60% or more when the simulation frequency of the input signal matches the design frequency, but such higher maximum drain efficiency which is peculiar to a Doherty amplifier is not obtained when the simulation frequency of the input signal is different from the design frequency. In contrast, the multiband Doherty amplifier 10 of the present invention obtains the drain efficiency equal to or above 62% both when the simulation frequency of the input signal is 1 GHz and 2 GHz. From this, the configuration of the multiband Doherty amplifier 10 of the present invention can be said to be more effective than the conventional Doherty amplifier.

From the results of the computer simulation in above FIGS. 6A, 6B and FIGS. 7A, 7B, the following can be said.

From FIGS. 6A, 6B, it is evident that all of the multiband Doherty amplifier 10 of the present invention, the conventional Doherty amplifier whose design frequency is 1 GHz and the conventional Doherty amplifier whose design frequency is 2 GHz have obtained sufficient gains. This is because the above described computer simulation assumes that both the multiband Doherty amplifier 10 of the present invention and the conventional Doherty amplifier use C-band GaAs MESFET for the carrier amplifier and the peak amplifier and sufficient small signal gains have been obtained in the examined cases of 1 GHz and 2 GHz.

However, as shown in FIGS. 7A and 7B, when the simulation frequency of the input signal and the design frequency are different, the conventional Doherty amplifier cannot obtain higher maximum drain efficiency which is peculiar to the Doherty amplifier. This is because when the simulation frequency of the input signal is different from the design frequency, the conventional Doherty amplifier cannot combine the carrier amplifier output signal and the peak amplifier output signal in phase with each other. In contrast, in the case of the multiband Doherty amplifier 10 of the present invention, sufficient maximum drain efficiency is obtained in the examined cases of 1 GHz and 2 GHz.

Furthermore, the delay transmission line 14 of the multiband Doherty amplifier 10 illustrated here is a mere 50 Ohm transmission line and does not have substantially identical impedance conversion characteristic at a plurality of frequencies (1 GHz and 2 GHz in this example) as in the case of the multiband impedance converter 13. Notwithstanding, the multiband Doherty amplifier 10 illustrated here obtains sufficient maximum drain efficiency in the examined cases of 1 GHz and 2 GHz. Therefore, it is evident that impedance mismatching at the input port of the peak amplifier 15 caused by a difference in the signal frequency has substantially no influence on the drain efficiency of the multiband Doherty amplifier 10. That is, a delay element having the same configuration as that of the multiband impedance converter 13 need not always be used instead of the delay transmission line 14.

[Simulation Result 2]

Next, computer simulation results of a configuration (examined configuration) using a ¼-wave transmission line (design frequency: 1 GHz) instead of the multiband combiner 16 of the multiband Doherty amplifier 10 of the present invention will be shown. The following simulation results show a case where N=2, using the multiband impedance converter 13 illustrated in FIG. 2B. Furthermore, suppose the conventional Doherty amplifier to be compared here is one in which the impedance converter on the carrier amplifier side is a ¼-wave transmission line (design frequency: 1 GHz), a ¼-wave transmission line is connected on the input side of the peak amplifier and a combiner having ¼-wave transmission line (design frequency: 1 GHz) is used. Moreover, here, both the multiband Doherty amplifier 10 of the present invention and the conventional Doherty amplifier are assumed to use C-band GaAs MESFET for the carrier amplifier and the peak amplifier. Furthermore, an input signal is assumed to be a CW1 wave.

First, computer simulation results of an examined configuration (examined configuration 1) using a ¼-wave transmission line (design frequency: 1 GHz) instead of the multiband combiner 16 of the multiband Doherty amplifier 10 of the present invention and using the same configuration as that of the multiband impedance converter 13 in FIG. 2B as the delay transmission line 14 will be shown.

Figure 8A:
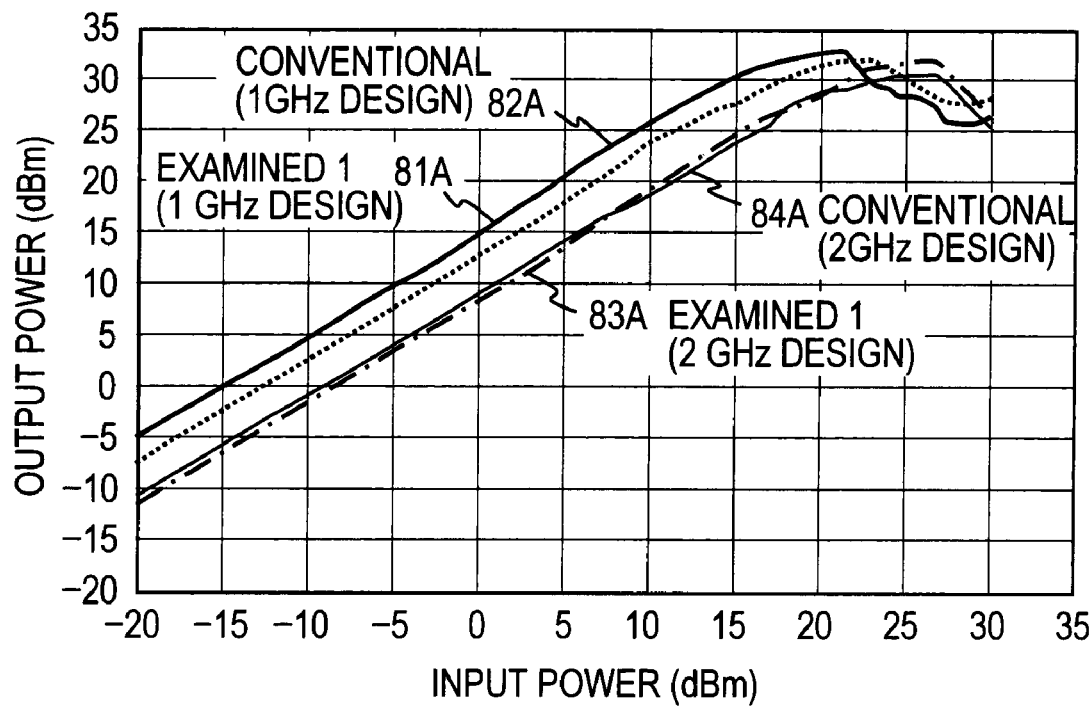
FIG. 8A shows input/output characteristics of examined configuration 1 (examined configuration 1; 1 GHz) and conventional configuration (conventional configuration; 1 GHz) when the simulation frequency of the input signal is 1 GHz and 2 GHz.
Figure 8B:
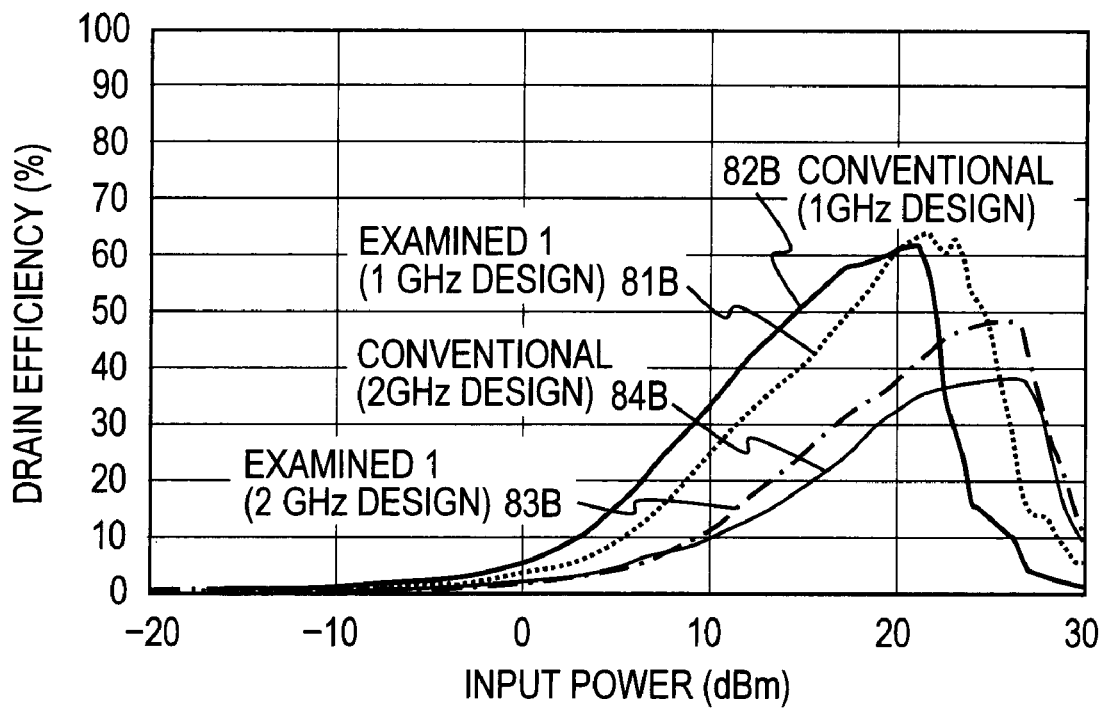
FIG. 8B shows drain efficiency characteristics of examined configuration 1 (examined configuration 1; 2 GHz) and conventional configuration (conventional configuration; 2 GHz) when the simulation frequency of the input signal is 1 GHz and 2 GHz.

FIG. 8A shows the input/output characteristics 81A of the examined configuration 1 (examined configuration 1; 1 GHz) and the input/output characteristics 82A of the conventional configuration (conventional configuration; 1 GHz) when the simulation frequency of the input signal is 1 GHz, and the input/output characteristics 83A of the examined configuration 1 (examined configuration 1; 2 GHz) and the input/output characteristics 84A (conventional configuration; 2 GHz) when the simulation frequency of the input signal is 2 GHz. The horizontal and vertical axes in FIG. 8A show the input power and the output power, respectively. Furthermore, FIG. 8B shows the drain efficiency characteristic 81B of the examined configuration 1 (examined configuration 1; 1 GHz) and the drain efficiency characteristic 82B of the conventional configuration (conventional configuration; 1 GHz) when the simulation frequency of the input signal is 1 GHz, and the drain efficiency characteristic 83B of the examined configuration 1 (examined configuration 1; 2 GHz) and the drain efficiency characteristic 84B of the conventional configuration (conventional configuration; 2 GHz) when the simulation frequency of the input signal is 2 GHz. The horizontal and vertical axes in FIG. 8B show the input power and the drain efficiency.

As shown in FIGS. 8A, 8B, when the simulation frequency of the input signal is 1 GHz, the output power and the drain efficiency with respect to the input power 10 dBm respectively degrades by 2 dB and 10% in the case of the examined configuration 1 compared to the conventional configuration. Furthermore, when the simulation frequency of the input signal is 2 GHz, the output power characteristic of the examined configuration 1 substantially matches that of the conventional configuration, but the drain efficiency at saturation output power point improves approximately 10% in the examined configuration 1 compared to the conventional configuration. However, none of the configurations achieves high efficiency amplification at 1 GHz and 2 GHz.

Next, computer simulation results when a ¼-wave transmission line (design frequency: 1 GHz) is used instead of the multiband combiner 16 of the multiband Doherty amplifier 10 of the present invention and a delay transmission line of 50 Ohm is used as the delay transmission line 14 (examined configuration 2), that is, when the delay transmission line 14 in the simulation result 2 is configured using a ¼-wave transmission line instead of a multiband impedance converter will be shown.

Figure 9A:
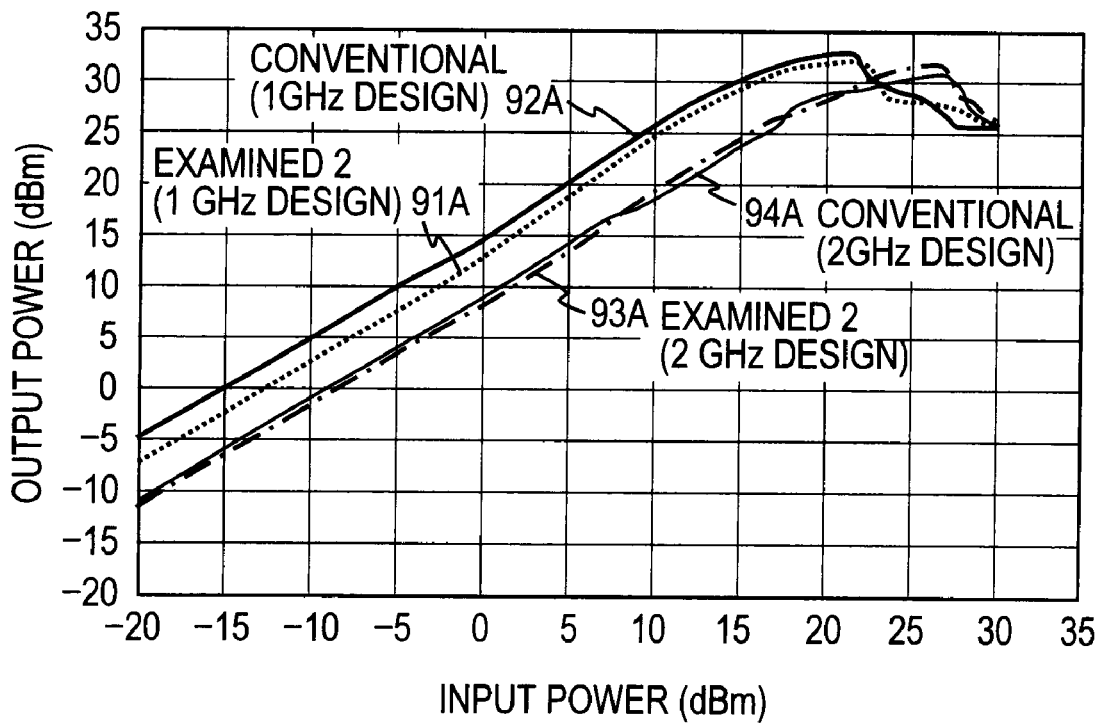
FIG. 9A shows input/output characteristics of examined configuration 2 (examined configuration 2; 1 GHz) and conventional configuration (conventional configuration; 1 GHz) when the simulation frequency of the input signal is 1 GHz and 2 GHz.
Figure 9B:
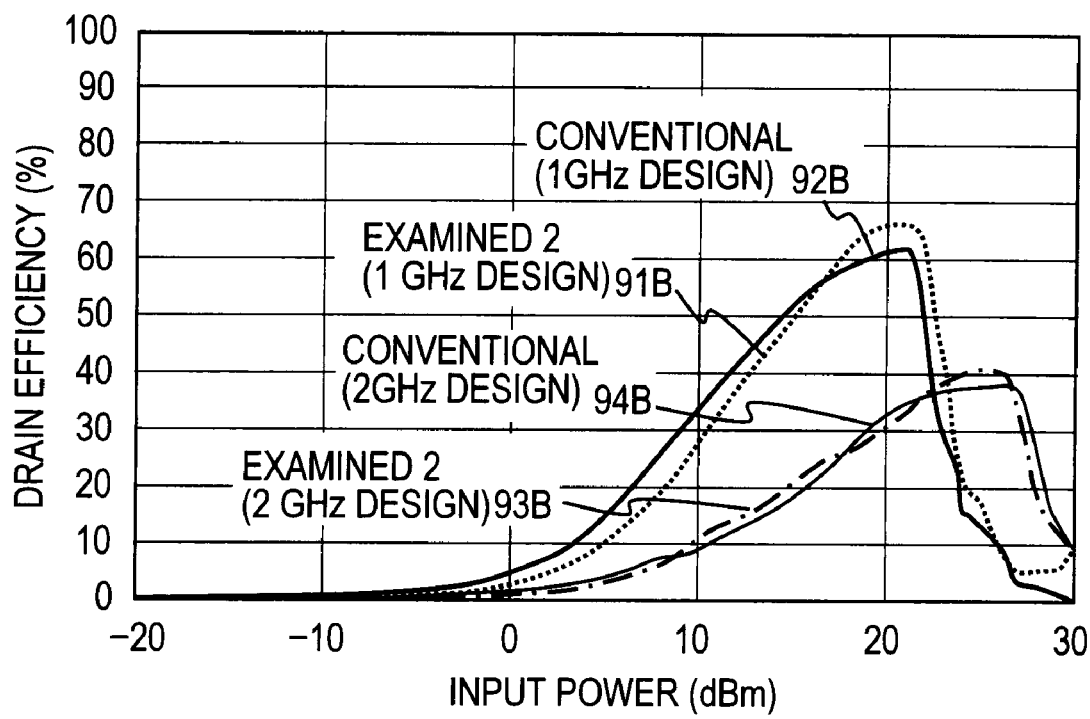
FIG. 9B shows drain efficiency characteristics of examined configuration 2 (examined configuration 2; 2 GHz) and conventional configuration (conventional configuration; 2 GHz) when the simulation frequency of the input signal is 1 GHz and 2 GHz.
Figure 10:
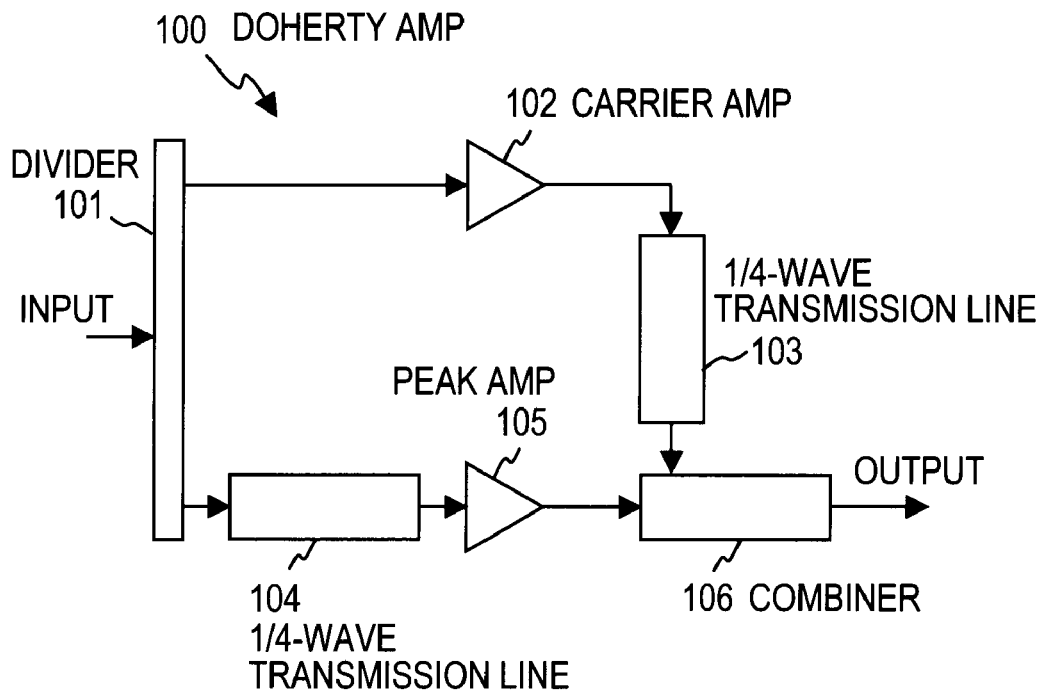
FIG. 10 shows the basic configuration of a conventional Doherty amplifier.
Figure 11:
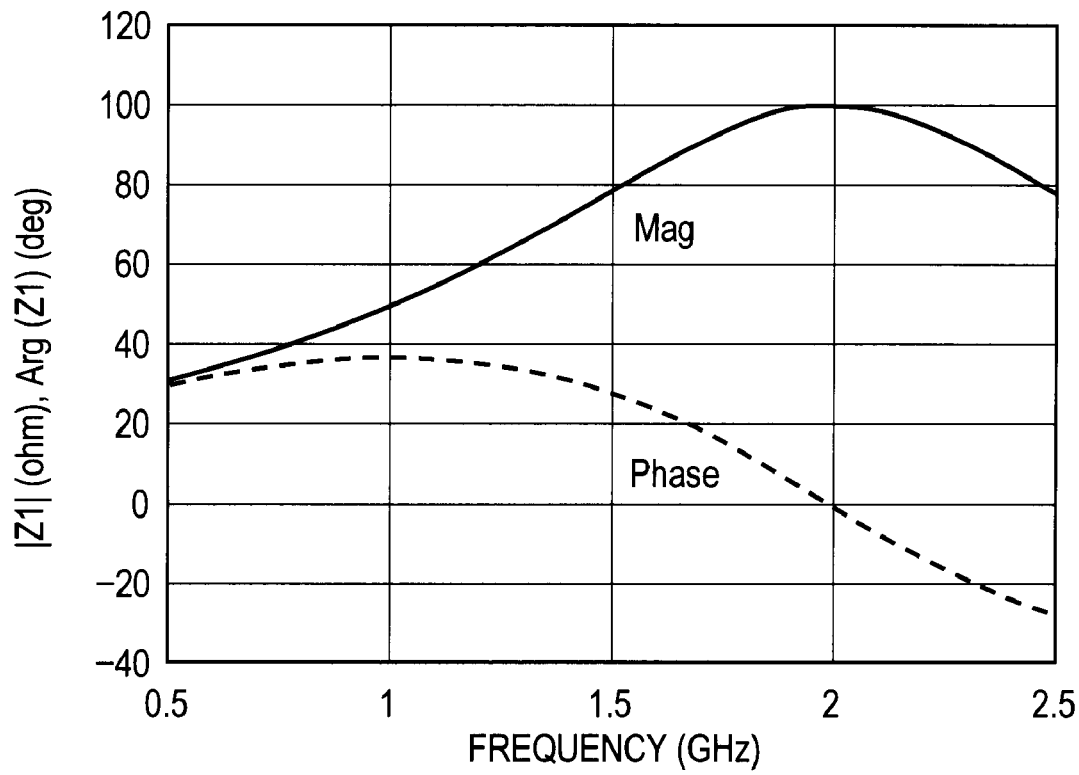
FIG. 11 shows an input impedance on the carrier amplifier side of the ¼-wave transmission line designed to perform a desired impedance conversion at design frequency 2 GHz.

FIG. 9A shows the input/output characteristics 91A of the examined configuration 2 (examined configuration 2; 1 GHz) and the input/output characteristics 92A of the conventional configuration (conventional configuration; 1 GHz) when the simulation frequency of the input signal is 1 GHz, and the input/output characteristics 93A of the examined configuration 2 (examined configuration 2; 2 GHz) and the input/output characteristics 94A (conventional configuration; 2 GHz) when the simulation frequency of the input signal is 2 GHz. The horizontal and vertical axes in FIG. 9A show the input power and the output power, respectively. Furthermore, FIG. 9B shows the drain efficiency characteristic 91B of the examined configuration 2 (examined configuration 2; 1 GHz) and the drain efficiency characteristic 92B of the conventional configuration (conventional configuration; 1 GHz) when the simulation frequency of the input signal is 1 GHz, and the drain efficiency characteristic 93B of the examined configuration 2 (examined configuration 2; 2 GHz) and the drain efficiency characteristic 94B of the conventional configuration (conventional configuration; 2 GHz) when the simulation frequency of the input signal is 2 GHz. The horizontal and vertical axes in FIG. 9B show the input power and the drain efficiency, respectively.

As shown in FIGS. 9A, 9B, when the simulation frequency of the input signal is 1 GHz, the input/output power (gain) and the drain efficiency of the examined configuration 2 slightly degrade compared to the conventional configuration. On the other hand, when the simulation frequency of the input signal is 2 GHz, these are approximately equal, but none of the configurations achieves high efficiency amplification at 1 GHz and 2 GHz.

From the results of the computer simulation in above FIGS. 8A, 8B and of FIGS. 9A, 9B, the following can be said.

When the multiband combiner 16 with N cascade-connected impedance conversion transmission lines is adopted as the combiner of the multiband Doherty amplifier 10, higher efficiency amplification performance at a plurality of frequencies (1 GHz and 2 GHz in this example) improves compared to the case where a mere ¼-wave transmission line is used for the combiner.

Furthermore, when the input/output characteristics and the efficiency characteristic are comprehensively judged, there is no significant difference in performance when using the same configuration as that of the multiband impedance converter 13 as the delay element on the peak amplifier input side and when using a mere delay transmission line (e.g., 50 Ohm transmission line).

The present invention is not limited to the above described embodiment. For example, the above described embodiment has shown the simulation results of the multiband Doherty amplifier in the case where N=2 and the design frequencies are 1 GHz and 2 GHz, but the present invention is not limited to this. That is, N may be a natural number equal to or greater than 3 and the design frequency of the multiband Doherty amplifier may or may not include 1 GHz and 2 GHz. Furthermore, it goes without saying that these may be modified as appropriate within a range without departing from the essence of the present invention.

Examples of fields of industrial application of the multiband Doherty amplifier of the present invention include a communication system which amplifies a signal at a plurality of frequencies, in which a mean value of the signal amplitude is considerably different from a maximum value thereof. As described above, the multiband Doherty amplifier of the present invention can amplify signals in a plurality of frequency bands with high efficiency. Therefore, using the multiband Doherty amplifier of the present invention as the transmission amplifier of such a system makes it possible to realize low power consumption in a transmission amplifier. Furthermore, by realizing low power consumption of the transmission amplifier, it is also possible to realize a reduction in size and weight of a transmitter. The field of application of the multiband Doherty amplifier of the present invention is not limited to such a communication system.

What is claimed is:

1. A multiband Doherty amplifier comprising:
   a divider for dividing an input signal into two divided signals;
   a carrier amplifier connected to one output port of the divider, for amplifying one of the divided signals;
   a delay element connected to the other output port of the divider, for delaying the other divided signal;
   a peak amplifier connected to an output port of the delay element, for amplifying an output signal thereof;
   an impedance converter connected to an output port of the carrier amplifier, for performing an impedance conversion; and
   a combiner comprising a first cascade connection of N impedance conversion transmission lines connected at a joint at which an output port of the peak amplifier and an output port of the impedance converter are joined, for combining the output signals therefrom and performing identical impedance conversion for each of N frequencies, N being an integer equal to or greater than 2;
   wherein an electric length of the delay element is equal to the electric length of the impedance converter,
   the impedance converter comprises a second cascade connection of N impedance conversion transmission lines, each having a different line width, performing identical impedance conversion for each of the N frequencies, and the first cascade connection of the combiner causes, while the peak amplifier is in amplification operation, a load impedance seen from the joint to match an output impedance seen from the joint for each of the N frequencies.

2. The multiband Doherty amplifier according to claim 1, in which the delay element is a delay transmission line which has a configuration different from that of the impedance converter.

\* \* \* \* \*